(12) United States Patent
Wang

(10) Patent No.: US 6,373,700 B1
(45) Date of Patent: Apr. 16, 2002

(54) HEAT SINK MODULAR STRUCTURE INSIDE AN ELECTRONIC PRODUCT

(75) Inventor: Feng Ku Wang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 09/882,183

(22) Filed: Jun. 18, 2001

(51) Int. Cl.[7] ................................................. H05K 7/20
(52) U.S. Cl. .................. 361/698; 165/104.33; 361/687; 361/700
(58) Field of Search .............................. 174/15.2, 16.3; 62/259.2; 257/714, 715, 721, 722; 165/104.33, 121–126, 80.3, 80.4; 415/177, 178, 213.1, 214.1; 361/687, 690, 694, 695, 697, 699, 703, 700, 704, 698, 717–719

(56) References Cited

U.S. PATENT DOCUMENTS

| | | | | |
|---|---|---|---|---|
| 5,875,095 A | * | 2/1999 | Webb | ......................... 361/700 |
| 6,122,169 A | * | 9/2000 | Liu et al. | |
| 6,125,035 A | * | 9/2000 | Hood, III et al. | ........... 361/687 |
| 6,226,178 B1 | * | 5/2001 | Broder et al. | ............... 361/687 |
| 6,233,146 B1 | * | 5/2001 | Gilchrist et al. | |
| 6,328,097 B1 | * | 12/2001 | Bookhardt et al. | .... 165/104.33 |

* cited by examiner

Primary Examiner—Gerald Tolin
(74) Attorney, Agent, or Firm—Bacon & Thomas, PLLC

(57) ABSTRACT

The present invention of a heat sink modular structure inside an electronic product comprises of a heat sink fan mounted on one end of an air channel pipe body blowing the heat thereon outward from an outlet of an air channel disposed inside the said air channel pipe body, and blowing another draft of cold air from an outlet of another air channel disposed inside the said air channel pipe body to the said CPU and the electronic parts adjacent to its surrounding to enable the heat generated by the other electronic parts inside the said electronic product to have sufficient air convection.

5 Claims, 3 Drawing Sheets

HEAT SINK MODULAR STRUCTURE INSIDE AN ELECTRONIC PRODUCT

BACKGROUND OF THE INVENTION

1) Field of the Invention

The present invention relates to the field of heat sink and more particularly to a heat sink modular structure inside an electronic product.

2) Description of the Prior Art

Accordingly, the central processing unit (CPU) inside the available common electronic product (such as the notebook computer) and its surrounding electronic components usually generate high heat in operating or working situation; in the past, the heat generated from the CPU was not much, therefore the heat dissipation conducted by natural convection by means of heat sink pieces was good enough for cooling the CPU to make the surface temperature lower than the maximum work temperature.

However, along with the increased processing speed of the CPU, the heat diffused therewith rose also; therefore, a heat sink module installed additionally on the CPU to conduct heat dissipation is applied to the inside of the CPU that usually generates high heat.

Nevertheless, the mentioned conventional heat sink module still has some problems in regard to conducting the function of heat dissipation with the CPU, that is, the said heat sink module can only conduct the high heat generated by the CPU itself onto a heat exchanger at a far-end via a heat pipe on the heat sink module, then a heat sink fan at the other end blows the heat on the said heat exchanger outside the housing of the main unit; therefore, the shortcoming of the mentioned heat dissipation lies in that the single heat sink fan can only process the heat on the said heat exchanger but can't conduct any processing for the heat generated by other electronic parts adjacent to the surrounding of the said CPU inside the housing body of the main unit, that directly influences the said external housing body of the main unit and causes overheat, therefore, it results in the insufficient heat dissipation effect of the said entire heat sink module and further causes the instability or even the crash situation of the entire system.

Therefore, how to reserve the advantages of the original heat exchanger as well as to provide another draft of cold air blowing toward the inside of the system in order to have the effect of supplying sufficient air convection inside the system to prevent smolder inside the system and of cooling the other heat parts so as to eliminate the overheat situation generated by the external housing body and to further lower the temperature of the entire external housing body is actually a relatively important issue to be faced by the CPU in the present era of high speed.

SUMMARY OF THE INVENTION

It is therefore an object of the present invention to provide a heat sink modular comprising of a seat body, one lateral side of the said seat body extends outward and connects with one side of an air channel pipe body, a heat pipe is disposed on the said side extending along the air channel pipe body to the area of the seat body, thereby the heat generated by the surface of a central processing unit (CPU) can be conducted, via a heat block and a heat pipe on the said seat body, onto the air channel pipe body at a far-end, then a heat sink fan mounted on one end of the said air channel pipe body blows the heat on the said air channel pipe body outward from an outlet of an air channel disposed inside the said air channel pipe body, at the mean time, the said heat sink fan provides another draft of cold air blowing from an outlet of another air channel disposed inside the said air channel pipe body to the said CPU and the electronic parts adjacent to its surrounding to enable the heat generated by the other electronic parts inside the said electronic product to have sufficient air convection.

DETAILED DESCRIPTION OF THE PREFERRED EMBODIMENTS

Figure 1:
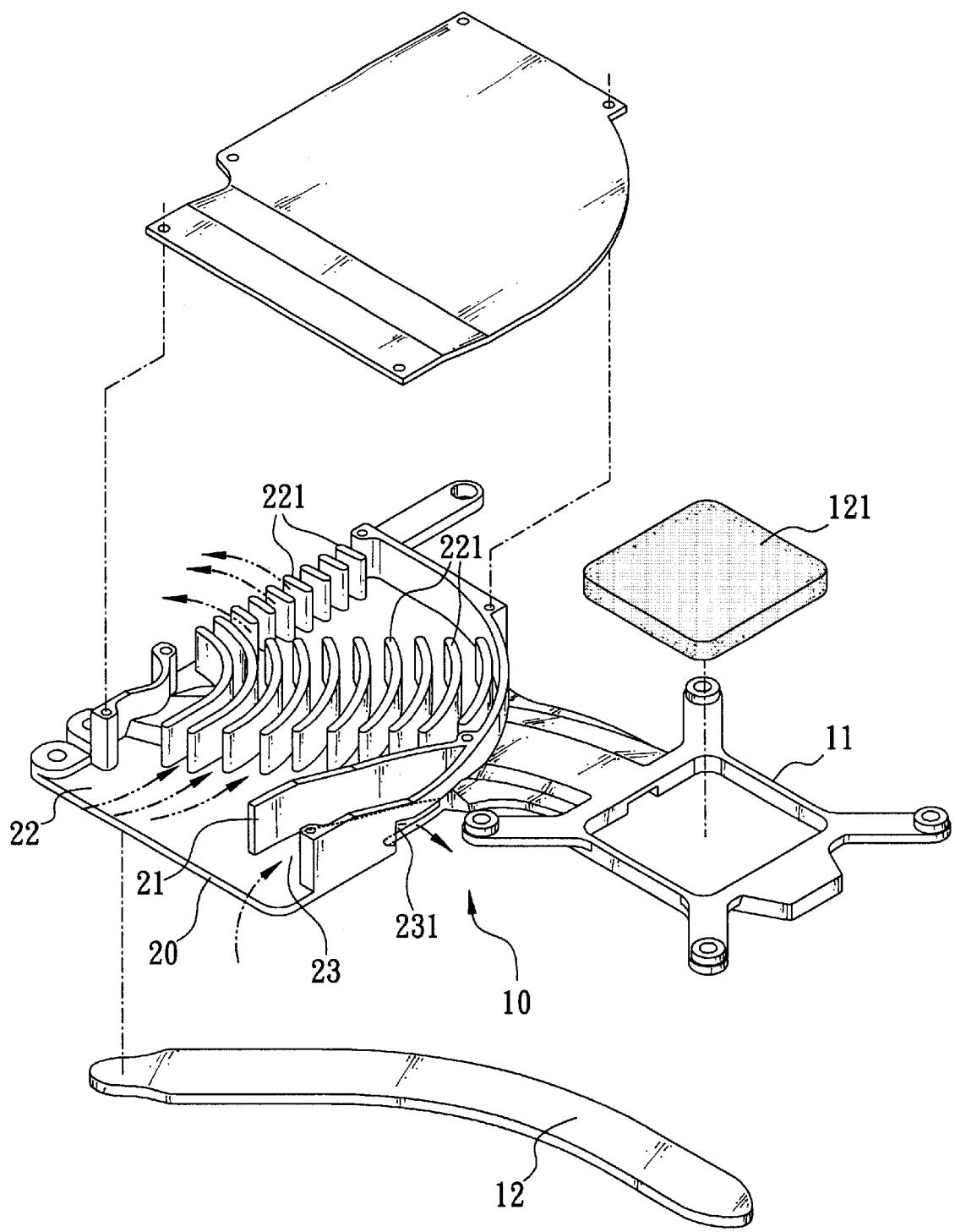
FIG. 1 is an exploded view of the heat sink modular according to the invention.
Figure 2:
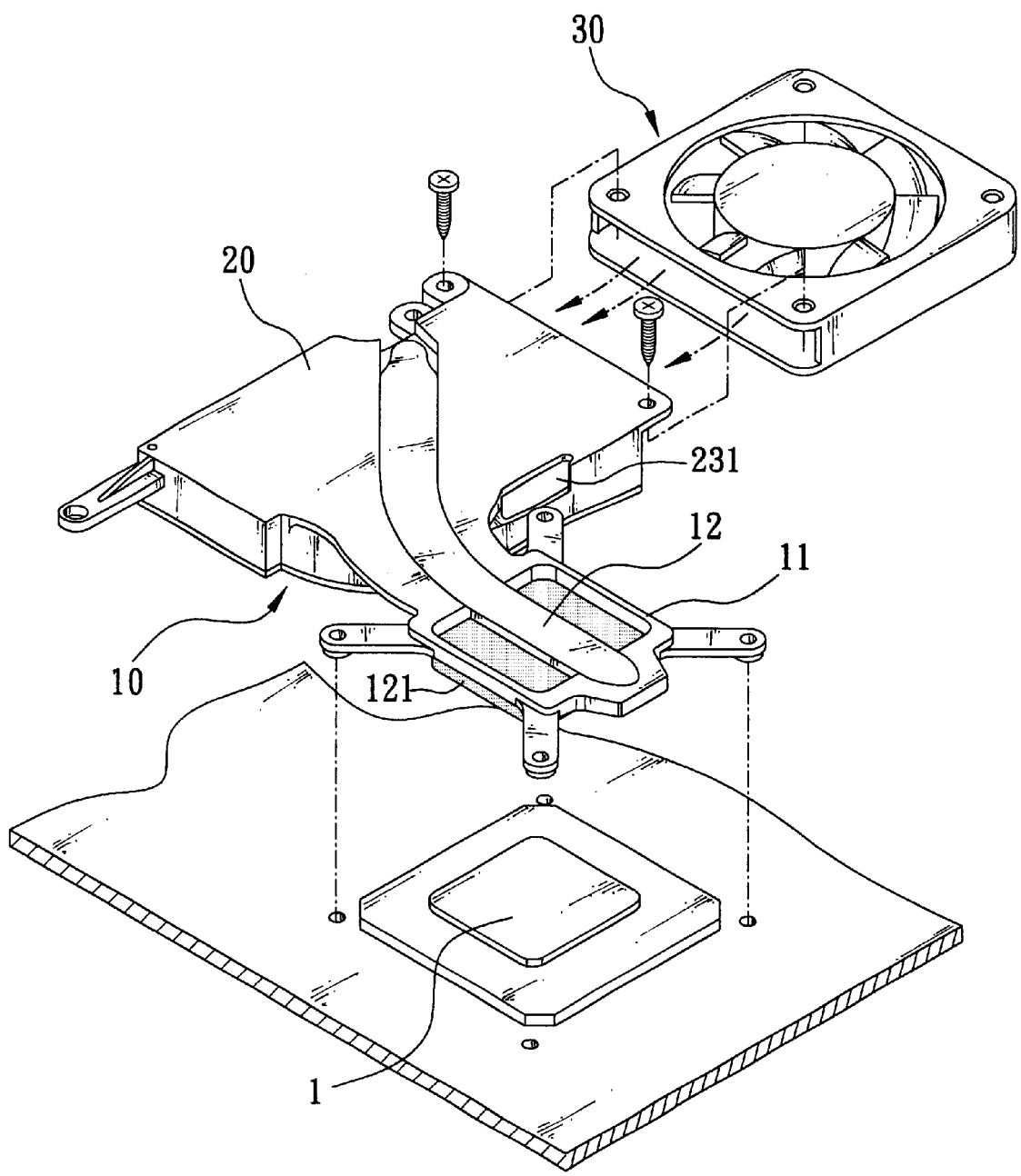
FIG. 2 is a perspective view of a preferred embodiment of the heat sink modular after being assembled according to the invention.
Figure 3:
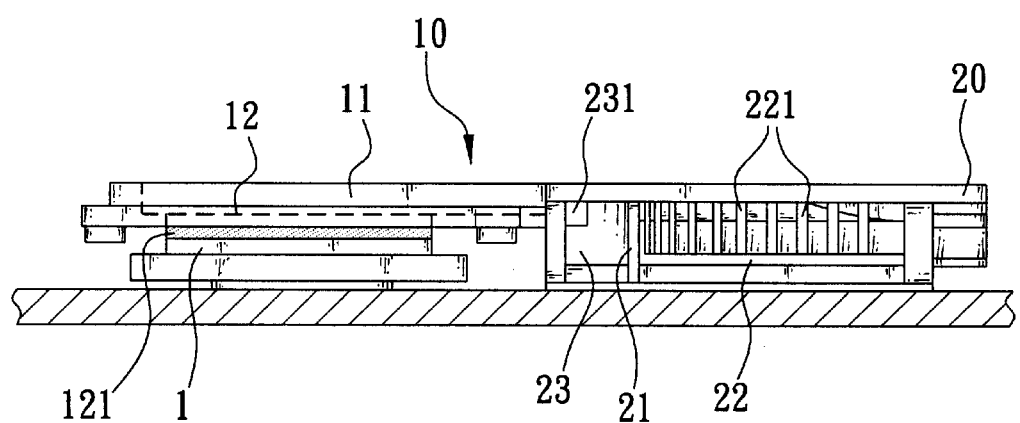
FIG. 3 is a sectional view of FIG. 2 according to the invention.

Referring to FIGS. 1, 2 and 3, the present invention of a heat sink modular structure inside an electronic product is applied onto a central processing unit (1) (CPU) inside an electronic product such as a notebook computer, the said module of heat sink pieces (10) is made of a good heat conductor such as aluminum and comprises of a seat body (11), as shown in FIG. 1, with a heat block (121) disposed thereon, also shown in FIG. 1, one lateral side of the said seat body (11) bends and extends outward to connect with one side of an air channel pipe body (20), a heat pipe (12) is disposed on the said side extending along the air channel pipe body (20) to the heat block (121) area of the seat body (11), thereby the heat generated from the surface of the CPU (1) can be conducted, via the said heat block (121) and the heat pipe (12), onto the air channel pipe body (20) at a far-end, then a heat sink fan (30) mounted on one end of the said air channel pipe body (20), as shown in FIG. 2, blows the heat on the said air channel pipe body (20) outward from another end and provides another draft of cold air blowing to the CPU (1) and the electronic parts (not shown in the Figure) adjacent to its surrounding, thereby the heat generated by the other electronic parts inside the said electronic product can have sufficient air convection, so as to prevent smolder inside the system and to cool the other heat parts to eliminate the overheat situation generated by the external housing body and to further lower the temperature of the entire external housing body.

In the present invention, the heat pipe (12) on the said seat body (11) is adhered to the said heat block (121), as shown in FIG. 1, by means of a heat glue (not shown in the Figure), the heat block (121) is adhered to the surface of the CPU (1) by means of the heat glue so as to enable the heat to be rapidly conducted to the said heat pipe (12). (The actual embodiment of the present invention is not limited herein, those skilled in the art might make various alternation with equal efficiency, however, all of the alternations should be included in the spirit and the scope of the present invention.)

In the present invention, a partition board (21) is mounted at an end where the inside of the said air channel pipe body (20) connects with the heat sink fan (30), as shown in FIGS. 1 and 3; by means of the said partition board (21), the inside of the air channel pipe body (20) can be partitioned into one air channel (22) and another air channel (23), wherein a plurality of arcuate wing pieces (221) spaced with equal intervals are disposed inside the said air channel (22) adjacent to the heat pipe (12), thereby the heat sink fan (30) can blow the heat absorbed on the said wing pieces (221)

outward from another end of the said air channel pipe body (20); furthermore, the outlet (231) of the said another air channel (23) is situated adjacent to the joint area where the said air channel pipe body (20) meets the extended seat body (11), thereby the heat sink fan (30) provides another draft of cold air blowing from the outlet (231) of the said another air channel (23) to the said CPU (1) and the electronic parts adjacent to its surrounding, as shown in FIG. 3, so as to make the heat generated form the other electronic parts inside the said electronic product have sufficient air convection.

By virtue of the mentioned components, the heat generated on the surface of the said CPU (1), as shown in FIG. 2 and 3, can be conducted, via heat conduction of the said heat glue, the heat block (121) and the heat pipe (12), onto the said air channel pipe body (20), then the said heat sink fan (30) blows the heat on the said air channel pipe body (20) outward from another end of the said air channel (22), at the mean time, the said heat sink fan (30) provides another draft of cold air blowing from the outlet (231) of the said another channel (23) to the said CPU (1) and the electronic parts adjacent to its surrounding, thereby to make the heat generated by the other electronic parts inside the said electronic product have sufficient air convection.

Therefore, the heat generated by the other electronic parts inside the said electronic product possess the effect of supplying sufficient air convention so as to prevent smolder inside the system, to cool the other heat parts, to eliminate the overheat situation generated by the external housing body and to further achieve the objective of lowering the temperature of the entire external housing body.

What is claimed is:

1. A heat sink modular structure inside an electronic product comprises:

a seat body, with a heat block disposed thereon to be adhered to the surface of a central processing unit (CPU), one lateral side of the said seat body extends outward to connect with one side of an air channel pipe body;

a heat pipe is disposed at the contact area where the said side extends to the seat body and the heat block for conducting the heat of the said CPU onto the said air channel pipe body; wherein the inside of the air channel pipe body is disposed with one air channel and another air channel, thereby a heat sink fan mounted at one end where the air channel pipe body possessing the air channel and the another air channel blows the heat on the said air channel pipe body outward from the outlet of the said air channel and provides another draft of air blowing from the outlet of the said another air channel to the said CPU and the electronic parts adjacent to its surrounding.

2. A heat sink modular structure inside an electronic product according to claim 1, wherein the inside of the said air channel pipe body is partitioned into the said air channel and another air channel by means of a partition board.

3. A heat sink modular structure inside an electronic product according to claim 2, wherein a plurality of arcuate wing pieces spaced with equal intervals are mounted inside the said air channel adjacent to the heat pipe area, thereby the heat sink fan can blow out the heat absorbed on those wing pieces from another end of the said air channel pipe body.

4. A heat sink modular structure inside an electronic product according to claim 2, wherein the outlet of the said another air channel is situated adjacent to the joint area of the said air channel pipe body and the extended seat body, thereby the heat sink fan can provide another draft of cold air blowing form the outlet of the said another air channel to the said CPU and the electronic parts adjacent to its surrounding so as to make the heat generated by the other electronic parts inside the said electronic product have sufficient air convention.

5. A heat sink modular structure inside an electronic product according to claim 1, wherein the heat block and the heat pipe on the said seat body are adhered respectively to the surface of the said CPU by means of a heat glue to enable the heat to be rapidly conducted to the said heat pipe.

* * * * *